(12) United States Patent
Tanaka

(10) Patent No.: US 7,710,169 B2
(45) Date of Patent: May 4, 2010

(54) SEMICONDUCTOR INTEGRATED CIRCUIT CONTROLLING OUTPUT IMPEDANCE AND SLEW RATE

(75) Inventor: Yoshihiro Tanaka, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/876,231

(22) Filed: Oct. 22, 2007

(65) Prior Publication Data

US 2008/0094112 A1    Apr. 24, 2008

(30) Foreign Application Priority Data

Oct. 20, 2006   (JP)   ............... 2006-285853

(51) Int. Cl.
*H03K 3/00*   (2006.01)
*H03B 1/00*   (2006.01)
(52) U.S. Cl. .............. 327/112; 327/108; 326/82; 326/84; 326/85
(58) Field of Classification Search ......... 327/108–112, 327/170; 326/82, 83, 87, 26, 27, 30
See application file for complete search history.

(56) References Cited

U.S. PATENT DOCUMENTS 5,285,116 A * 2/1994 Thaik ................ 326/21
6,163,499 A * 12/2000 Suzuki ............... 365/230.06
7,196,540 B2 * 3/2007 Ueno ................. 326/30

FOREIGN PATENT DOCUMENTS

| JP | 2002-026712 A | 1/2002 |
| JP | 2003-188705 A | 7/2003 |
| JP | 2004-032721 A | 1/2004 |
| JP | 2004-327602 A | 11/2004 |

* cited by examiner

*Primary Examiner*—Lincoln Donovan
*Assistant Examiner*—Brandon S Cole
(74) *Attorney, Agent, or Firm*—Young & Thompson

(57) ABSTRACT

A semiconductor integrated circuit according to the invention has a plurality of output transistors connected to an output terminal through which output data is outputted, and an impedance control circuit and a slew rate control circuit. The impedance control circuit generates control signals specifying output transistors to be turned on when the output data is output, from among the plurality of output transistors. The slew rate control circuit generates, according to the control signals, drive signals driving the output transistors to be turned on, and variably sets respective delay times of the drive signals according to the control signals.

7 Claims, 7 Drawing Sheets

FIG. 2

| DATA | IMPEDANCE SETTING CODE | | | DRIVE SIGNAL | | | | OUTPUT TRANSISTOR | | | | |
|---|---|---|---|---|---|---|---|---|---|---|---|---|
| | PA | PB | PC | P0 | P1 | P2 | P3 | MP0 | MP1 | MP2 | MP3 | ON NUMBER |
| 0 | – | – | – | 1 | 1 | 1 | 1 | × | × | × | × | 0 |
| 1 | 0 | 0 | 0 | 0 | 1 | 1 | 1 | ○ | × | × | × | 1 |
| | 1 | 0 | 0 | 0 | 0 | 1 | 1 | ○ | ○ | × | × | 2 |
| | 1 | 1 | 0 | 0 | 0 | 0 | 1 | ○ | ○ | ○ | × | 3 |
| | 1 | 1 | 1 | 0 | 0 | 0 | 0 | ○ | ○ | ○ | ○ | 4 |

| DATA | IMPEDANCE SETTING CODE | | | DRIVE SIGNAL | | | | OUTPUT TRANSISTOR | | | | |
|---|---|---|---|---|---|---|---|---|---|---|---|---|
| | PA | PB | PC | P0 | P1 | P2 | P3 | MP0 | MP1 | MP2 | MP3 | ON NUMBER |
| 1 | – | – | – | 0 | 0 | 0 | 0 | × | × | × | × | 0 |
| 0 | 1 | 1 | 1 | 1 | 0 | 0 | 0 | ○ | × | × | × | 1 |
| | 0 | 1 | 1 | 1 | 1 | 0 | 0 | ○ | ○ | × | × | 2 |
| | 0 | 0 | 1 | 1 | 1 | 1 | 0 | ○ | ○ | ○ | × | 3 |
| | 0 | 0 | 0 | 1 | 1 | 1 | 0 | ○ | ○ | ○ | ○ | 4 |

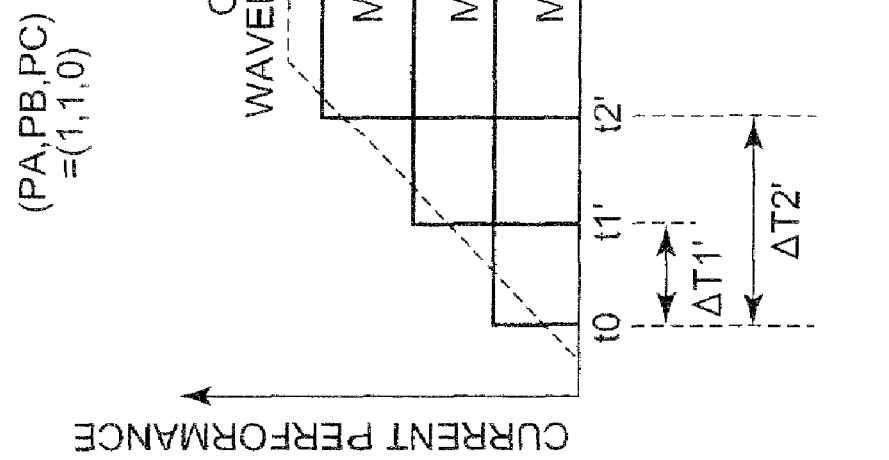
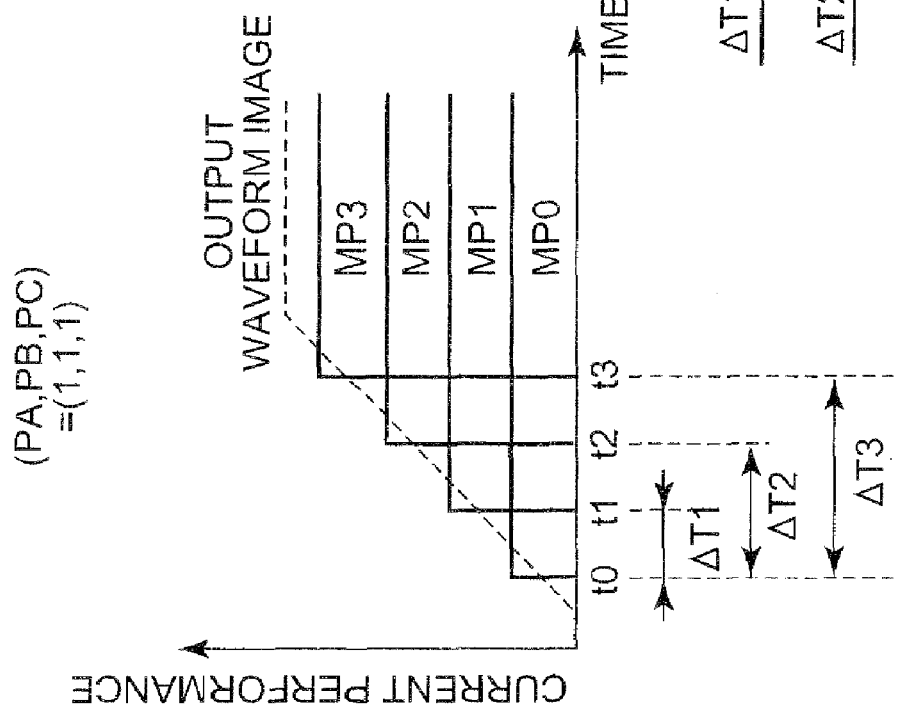

SEMICONDUCTOR INTEGRATED CIRCUIT CONTROLLING OUTPUT IMPEDANCE AND SLEW RATE

BACKGROUND OF THE INVENTION

1. Field of the Invention

The present invention relates to a semiconductor integrated circuit, and more particularly to a semiconductor integrated circuit controlling the output impedance and slew rate.

2. Description of the Related Art

In the fields of semiconductor integrated circuit, as techniques related to output impedance adjustment or slew rate adjustment, the following techniques have been known.

Japanese Patent Laid-Open No. 2004-32721 has disclosed a method of producing a control signal used for impedance matching. According to this conventional art, a replica circuit of a circuit to be impedance-matched having a plurality of MOSFETs connected in parallel is connected in series to an external reference resistor; and a voltage at a connection point therebetween is compared to a reference voltage. An impedance control circuit generates, based on the comparison result, a control signal determining the number of MOSFETs to be turned on in the replica circuit so that the above two voltages agree with each other. This control signal is supplied to the replica circuit, and is also supplied to the circuit to be impedance-matched to control the MOSFETs.

Japanese Patent Laid-Open No. 2002-26712 has disclosed a slew rate control circuit to adjust a slew rate. According to this conventional art, the slew rate is automatically set by use of an external reference resistor, irrespective of process states and environmental conditions. More specifically, the slew rate control circuit determines the operating current of a pre-buffer section based on a current value set by the external reference resistor. As a result, the slope of waveform inputted to a main buffer section becomes constant, irrespective of process states and environmental conditions; thus, the slew rate of the output buffer circuit is controlled.

Japanese Patent Laid-Open No. 2003-188705 has disclosed an output buffer circuit in which the output impedance can be switched according to a control signal from the outside. Also, while the output buffer circuit is mounted in a system, variations of cross point and slew rate due to variations of ambient environment can be substantially compensated for. The output buffer circuit includes a main buffer section and a pre-buffer section. More specifically, the main buffer section includes a plurality of MOSFETs; and the output impedance is switched by varying, according to a control signal from the outside, the number of MOSFETs driving a load. The pre-buffer section varies the drivability according to a control signal from the outside to thereby control the slew rate. That is, the output buffer circuit compensates for the slew rate according to the output impedance set by a signal from the outside.

Japanese Patent Laid-Open No. 2004-327602 has disclosed a technique of adjusting impedance and slew rate separately. A semiconductor integrated circuit device according to this conventional art includes an output circuit, first control means, and second control means. The output circuit includes a plurality of output MOSFETs connected in parallel. The first control means selects one to be turned on from among the plurality of output MOSFETs based on an impedance control code. The second control means regulates based on a slew rate control code, a drive signal of the output MOSFET to be turned on. The impedance control code is separated from the slew rate control code; thus, impedance and slew rate can be set separately while these do not affect each other.

The output impedance or slew rate of an output buffer may vary for each chip due to manufacturing variations. Also, the output impedance or slew rate may fluctuate due to fluctuations of operating environment such as power source voltage and temperature. These variations and fluctuations may cause a malfunction of the semiconductor integrated circuit. For example, when the slew rate is excessively high, noises such as overshoot or ringing become large, causing a malfunction of the semiconductor integrated circuit. In order to reduce such noises, the slew rate can be reduced by increasing the output impedance. In this case, however, the amplitude of output pulse may not be sufficiently large, resulting in outputting of erroneous data.

Thus, there is desired a technique by which the output impedance can be maintained at a desired value and at the same time the slew rate can also be controlled at a desired range. That is, there is desired a technique by which both the output impedance and slew rate can be controlled at a constant value. Here, according to the technique described in the above Japanese Patent Laid-Open No. 2004-327602, impedance control and slew rate control are performed separately and thus it is needed to prepare separate control means and separate control codes. This increases the area of circuit and complicates the control.

SUMMARY OF THE INVENTION

The present invention seeks to solve one or more of the above problems, or to improve upon those problems at least in part.

A semiconductor circuit according to the present invention includes an output buffer having a main buffer and pre-buffer and an impedance control circuit. The main buffer includes a plurality of output transistors which are connected in parallel. The impedance control circuit generates a plurality of control signals for specifying output transistors to be turned on. The pre-buffer generates a plurality of drive signals for each driving an associated one of the output transistors in response to the data signal and provides different delay times for each of the drive signals according the control signals.

The output impedance is controlled by specifying output transistors to be turned on at a time of outputting data according to the control signals. That is, when the number of output transistors to be turned on is controlled, the output impedance is controlled at a desired value. Meanwhile, the slew rate is controlled by adjusting respective ON timings of the output transistors to be turned on. To this end, the respective drive signals of the output transistors to be turned on are adjusted in delay time.

Further, the pre-buffer serving as the slew rate control circuit set each of delay times of the drive signals in response to the control signals. In other words, the slew rate control circuit controls the slew rate according to the control signals for controlling the output impedance at a desired value. That is, there is an association between the number and the ON timing of output transistors to be turned on; when the output impedance is controlled, the slew rate is automatically adjusted in an interlocked manner. As a result, the output impedance is controlled at a desired value and at the same time the slew rate is controlled at a desired range. Consequently, sufficiently large amplitude is provided for output pulse, and a malfunction ascribable to noise can also be prevented.

Further, according to the present invention, codes for output impedance control and codes for slew rate control do not need to be separately prepared. The control signals for controlling the output impedance at a desired value also contribute to the control of slew rate. Consequently, the circuit area is prevented from increasing, and the control is prevented from becoming complex.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a table illustrating a correspondence relationship between impedance setting code pattern and turned-on output transistor;

FIGS. 7A and 7B are graph charts for explaining an exemplary operation of an output buffer according to the present embodiment.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
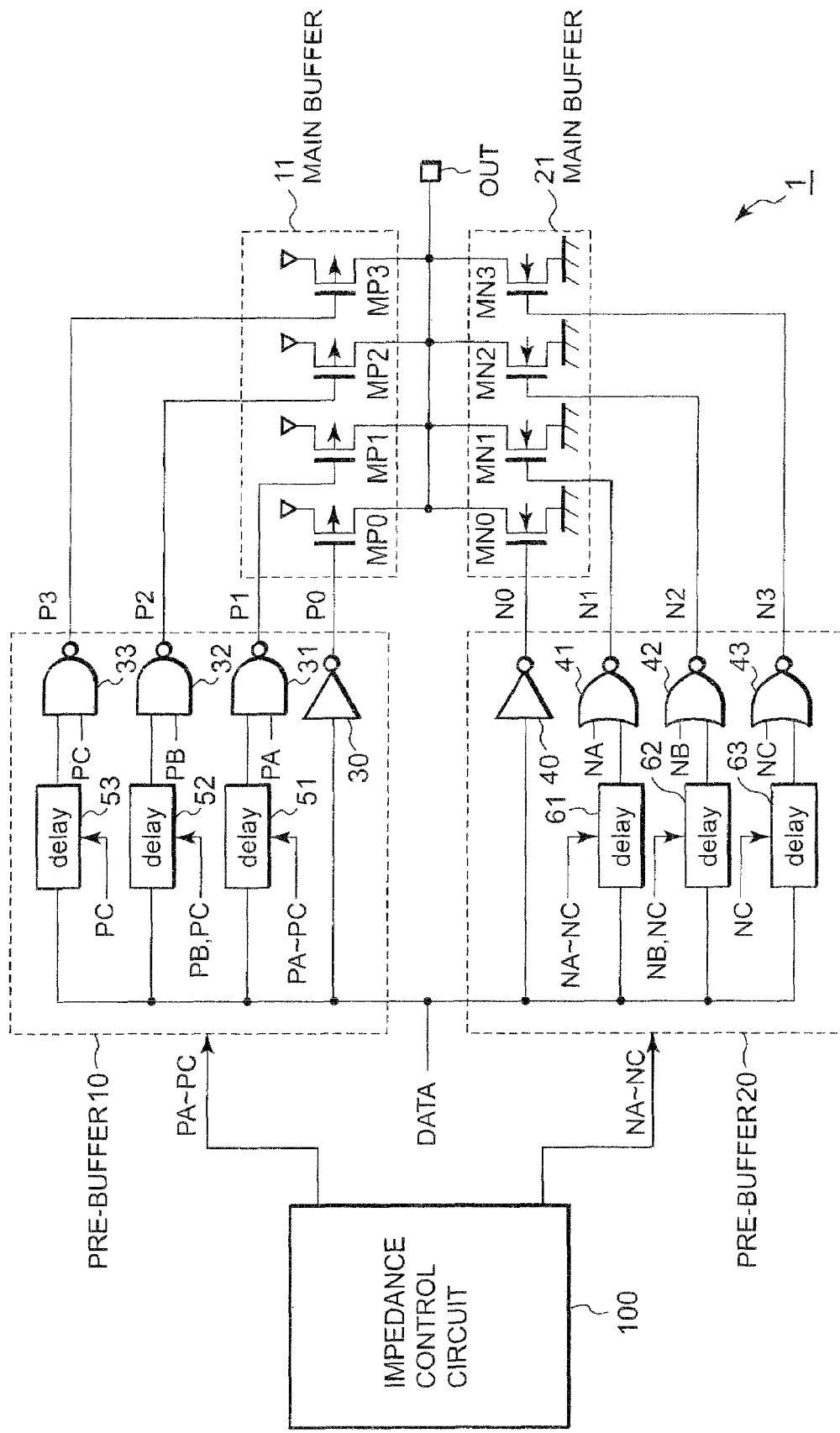
FIG. 1 is a circuit diagram illustrative of a semiconductor integrated circuit according to an embodiment of the present invention.

Referring to FIG. 1, the semiconductor integrated circuit includes an output terminal OUT, an output buffer 1 connected to the output terminal OUT, and an impedance control circuit 100 that controls the output impedance of the output buffer 1.

Data DATA read from a memory cell, for example by a sense amplifier is supplied as output data to the output buffer 1. Then, the output buffer 1 outputs the output data DATA via the output terminal OUT to the outside. As illustrated in FIG. 1, the output buffer 1 includes a pre-buffer 10, a main buffer 11, a pre-buffer 20 and a main buffer 21.

The main buffer 11 has output transistors MP0 to MP3 connected in parallel between a power source and the output terminal OUT. These output transistors MP0 to MP3 are PMOS transistors. Respective sources of the PMOS transistors MP0 to MP3 are connected to the power source, and the drains thereof are connected to the output terminal OUT. Respective gates of the PMOS transistors MP0 to MP3 are connected to outputs of the pre-buffer 10, and drive signals P0 to P3 are inputted to the respective gates.

The pre-buffer 10 has an inverter 30, NANDs 31 to 33, and delay circuits 51 to 53. Inputted to an input terminal of the inverter 30 is output data DATA. Inputted via the delay circuit 51 to one input terminal of the NAND 31 is output data DATA, and inputted to the other input terminal is signal PA. Inputted via the delay circuit 52 to one input terminal of the NAND 32 is output data DATA, and inputted to the other input terminal is signal PB. Inputted via the delay circuit 53 to one input terminal of the NAND 33 is output data DATA, and inputted to the other input terminal is signal PC. Output signals of the inverter 30 and NANDs 31 to 33 corresponds to the above drive signals P0 to P3, respectively, and are supplied to the gates of the output transistors MP0 to MP3, respectively. In this way, the pre-buffer 10 generates drive signal P0 according to output data DATA and generates drive signals P1 to P3 according to output data DATA and signals PA to PC. The function of signals PA to PC will be described later.

The main buffer 21 has output transistors MN0 to MN3 connected in parallel between the ground and the output terminal OUT. These output transistors MN0 to MN3 are NMOS transistors. Respective sources of the NMOS transistors MN0 to MN3 are connected to the ground, and the drains thereof are connected to the output terminal OUT. Respective gates of the NMOS transistors MN0 to MN3 are connected to outputs of the pre-buffer 20, and drive signals N0 to N3 are inputted to the respective gates.

The pre-buffer 20 has an inverter 40, NORs 41 to 43, and delay circuits 61 to 63. Inputted to an input terminal of the inverter 40 is output data DATA. Inputted via the delay circuit 61 to one input terminal of the NOR 41 is output data DATA, and inputted to the other input terminal is signal NA. Inputted via the delay circuit 62 to one input terminal of the NOR 42 is output data DATA, and inputted to the other input terminal is signal NB. Inputted via the delay circuit 63 to one input terminal of the NOR 43 is output data DATA, and inputted to the other input terminal is signal NC. Output terminals of the inverter 40 and NOR 41 to 43 are connected to the gates of the output transistors MN0 to MN3, respectively; output signals of the inverter 40 and NORs 41 to 43 corresponds to the above drive signals N0 to N3, respectively. In this way, the pre-buffer 20 generates drive signal N0 according to output data DATA and generates drive signals N1 to N3 according to output data DATA and signals NA to NC. The function of signals NA to NC will be described later.

In FIG. 1, four PMOS transistors MP0 to MP3 and four NMOS transistors MN0 to MN3 are illustrated as output transistors, but any number of output transistors can be used.

Impedance control will now be described.

In FIG. 1, when "1 (High level)" is outputted as output data DATA, the pre-buffer 10 and main buffer 11 work. When control signals PA to PC are all "1", drive signals P0 to P3 are all "0 (Low level)". As a result, all the output transistors MP0 to MP3 of the main buffer 11 turn on. However, when signal PA is "0", drive signal P1 is "1" and thus the output transistor MP1 turns off. That is, the number of turned-on output transistors decreases. Similarly, when signal PB is "0", drive signal P2 is "1" and thus the output transistor MP2 turns off. Also, when signal PC is "0", drive signal P3 is "1" and thus the output transistor MP3 turns off.

In this way, signal PA to PC serve as "control signal" specifying an output transistor to be turned on from among the output transistors MP0 to MP3 at a time of outputting output data DATA. In other words, the number of output transistors to be turned on at a time of outputting output data DATA is controlled by control signals PA to PC. As the number of output transistors to be turned on increases, the output impedance formed by the output transistors becomes smaller; as the number decreases, the output impedance becomes larger.

On the other hand, when output data DATA is "0 (Low level)", similar operations take place. In this case, the pre-buffer 20 and main buffer 21 work. Similarly to signals NA to NC, signals NA to NC act as "control signal" specifying an output transistor to be turned on from among the output transistors MN0 to MN3 at a time of outputting output data DATA.

That is, these control signals PA to PC and NA to NC which control the output impedance of the output buffer 1, can be called "impedance setting code".

As illustrated in FIG. 2, impedance setting codes {PA, PB, PC} are set to any one of four patterns {0,0,0} {1,0,0} {1,1,0} {1,1,1}. Also, impedance setting codes {NA, NB, NC} are set to any one of four patterns {1,1,1} {0,1,1} {0,0,1} {0,0,0}. Accordingly, the number of output transistors to be turned on is controlled at a range of 1 to 4.

The impedance control circuit 100 illustrated in FIG. 1 generates these impedance setting codes PA to PC and NA to NC and supplies them to the output buffer 1.

The output impedance may vary for each chip due to manufacturing variations. Also, the output impedance may fluctuate due to fluctuations of operating environment such as power source voltage and temperature. When the output impedance deviates from a desired value, desired circuit characteristics cannot be achieved, so the impedance control circuit 100 sets impedance setting codes PA to PC and NA to NC to proper values so that the output impedance of the output buffer 1 becomes a desired value (a constant value). That is, the impedance control circuit 100 also has a function of trimming impedance setting codes PA to PC and NA to NC.

Figure 3:
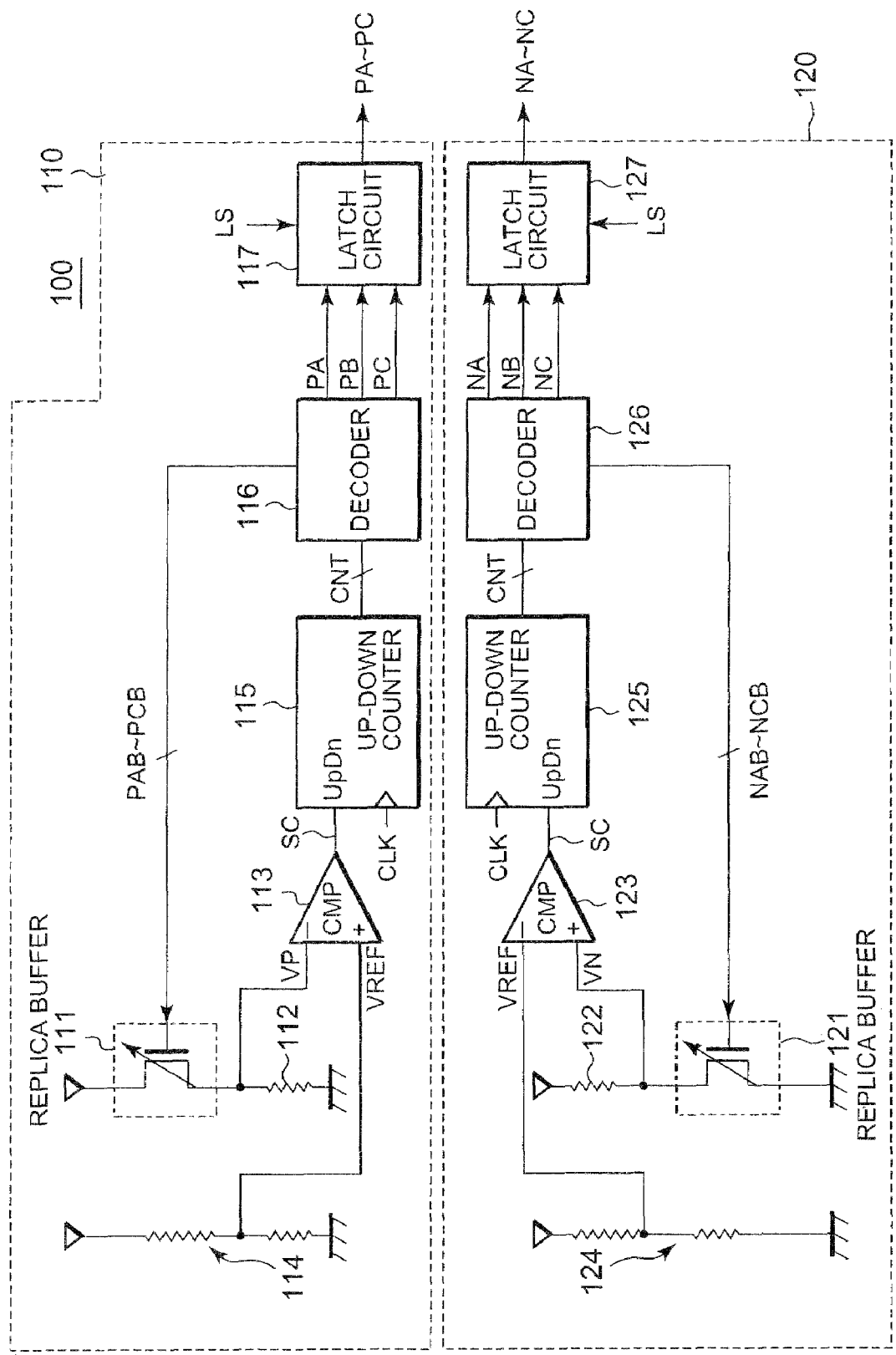
FIG. 3 is a block diagram illustrative of an impedance control circuit according to the present embodiment.

As illustrated in FIG. 3, for the purpose of trimming impedance setting codes PA to PC, the impedance control circuit 100 has a first impedance setting code trimming circuit 110 constituted of a replica buffer 111, resistor 112, comparator 113, dividing resistor 114, up-down counter 115, decoder 116 and latch circuit 117. Also, for the purpose of trimming impedance setting codes NA to NC, the impedance control circuit 100 has a second impedance setting code trimming circuit 120 constituted of a replica buffer 121, resistor 122, comparator 123, dividing resistor 124, up-down counter 125, decoder 126 and latch circuit 127.

The first impedance setting code trimming circuit 110 will be described. The replica buffer 111 has the same configuration as the main buffer 11 illustrated in FIG. 1 and has the same drivability. That is, the replica buffer 111 has the same transistor as PMOS transistors MP0 to MP3 connected in parallel. The transistor corresponding to the PMOS transistor MP0 is turned on at all times. The transistors corresponding to the PMOS transistors MP1 to MP3 are driven by signals PAB to PCB obtained by inverting impedance setting codes PA to PC. The replica buffer 111 serve as a variable resistor which has a resistance value varying according to these inversion signals PAB to PCB.

Potential VP obtained by resistive division between the replica buffer 111 serving as a variable resistor and the resistor 112 is inputted to an inversion input terminal of the comparator 113. Inputted to a non-inverted input terminal of the comparator 113 is reference potential VREF generated by the dividing resistor 114. The comparator 113 compares potential VP and reference potential VREF and outputs resultant signal SC indicating the comparison result to the up-down counter 115.

The up-down counter 115 performs a count operation dependent on the level of resultant signal SC in response to clock signal CLK. Count data CNT outputted from the up-down counter 115 is supplied to the decoder 116.

The decoder 116 decodes count data CNT and outputs impedance setting codes PA to PC and inversion signals PAB and PCB. For example, when count data CNT of 2 bits is "00", impedance setting code {PA, PB, PC} is {0, 0, 0}; when count data CNT is "01", impedance setting code {PA, PB, PC} is {1, 0, 0}; when count data CNT is "10", impedance setting code {PA, PB, PC} is {1, 1, 0}; when count data CNT is "11", impedance setting code {PA, PB, PC} is {1, 1, 1}. Inversion signals PAB to PCB of the generated impedance setting codes PA to PC are supplied to respective gates of the same transistors as transistors MP1 to MP3 in the replica buffer 111.

Using this configuration, impedance setting codes PA to PC are trimmed so that the output impedance becomes a desired value. More specifically, when potential VP is lower than reference potential VREF, resultant signal SC outputted from the comparator 113 has a High level and thus the up-down counter 115 performs a count-up operation. As a result, the resistance value of the replica buffer 111 decreases. On the contrary, when potential VP is higher than reference potential VREF, resultant signal SC outputted from the comparator 113 has a Low level and thus the up-down counter 115 performs a count-down operation. As a result, the resistance value of the replica buffer 111 increases. After a predetermined length of time from the start of trimming, in response to latch signal LS supplied to the latch circuit 117, the latch circuit 117 latches impedance setting codes PA to PC. The impedance control circuit 100 outputs the latched impedance setting codes PA to PC to the output buffer 1.

The second impedance setting code trimming circuit 120 has substantially the same configuration as the first impedance setting code trimming circuit 110, except that the replica buffer 121 has the same configuration as the main buffer 21 illustrated in FIG. 1 and except that potential VN obtained by resistive division between the replica buffer 121 and resistor 122 is inputted to a non-inverted input terminal of the comparator 123; therefore, an explanation thereof is omitted.

Impedance setting codes PA to PC and NA to NC may be trimmed in real-time. In this case, the latch circuits 117 and 127 are omitted. Instead, an averaging circuit is preferably arranged between the up-down counters 115 and 125 and the decoders 116 and 126.

As described above, the impedance control circuit 100 determines impedance setting codes PA to PC and NA to NC so that the output impedance of the output buffer 1 becomes a constant value. The determined impedance setting codes PA to PC and NA to NC control the number of transistors to be turned on at a time of outputting output data DATA. As a result, the output impedance is controlled at a predetermined value.

The slew rate control will now be described.

When the number of output transistors to be turned on is simply varied to set the output impedance to a desired value, the slew rate will vary. Particularly, effects of manufacturing variations of transistors are large; when a transistor having a lower ON resistance is used, the slew rate tends to become increasingly large. When the slew rate deviates from a desired value, a malfunction of the semiconductor integrated circuit may occur. For example, when the slew rate is excessively large, noises such as overshoot or ringing become large, causing a malfunction of the semiconductor integrated circuit. On the contrary, when the slew rate is excessively small, the amplitude of output pulse during high-speed operation does not become sufficiently large and thus logical decision cannot be made properly. According to the present embodiment, in order to control not only the output impedance but also the slew rate at a desired value, the following innovations have been designed.

As described above, the pre-buffer 10 illustrated in FIG. 1 generates drive signals P1 to P3 according to output data DATA and impedance setting codes PA to PC. According to the present embodiment, respective delay times of these drive signals P1 to P3 are set variably according to impedance setting codes PA to PC. Thus, the pre-buffer 10 is, as illustrated in FIG. 1, provided with specific delay circuits 51 to 53. Similarly, the pre-buffer 20 is provided with specific delay circuits 61 to 63.

Figure 4A:
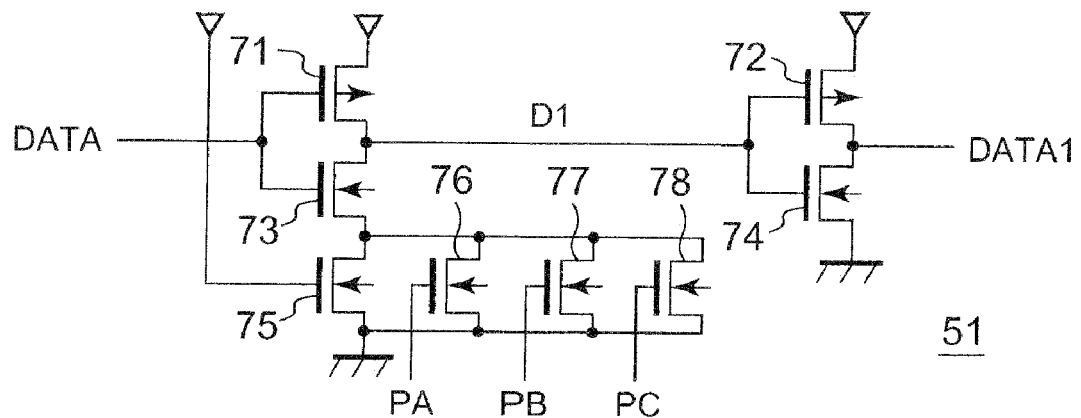
FIGS. 4A to 4C are circuit diagrams illustrating exemplary configurations of delay circuits that contribute to drive signals P1, P2 and P3, respectively.

FIG. 4A is a circuit diagram illustrating an exemplary configuration of the delay circuit 51 contributing to drive signal P1. The delay circuit 51 has a first inverter constituted of a PMOS transistor 71 and NMOS transistors 73 and 75 to 78, and a second inverter constituted of a PMOS transistor 72 and an NMOS transistor 74. The first inverter and second inverter are connected in series. In the first inverter, supplied to the gates of the PMOS transistor 71 and NMOS transistors 73 is output data DATA. The NMOS transistors 75 to 78 are connected in parallel between the NMOS transistor 73 and the ground. The gate of the NMOS transistor 75 is connected to the power source. Impedance setting codes PA to PC are supplied to the gates of the NMOS transistors 76 to 78, respectively. Using this configuration, the delay time of output data DATA is varied by the delay circuit 51 according to impedance setting codes PA to PC.

Figure 4B:
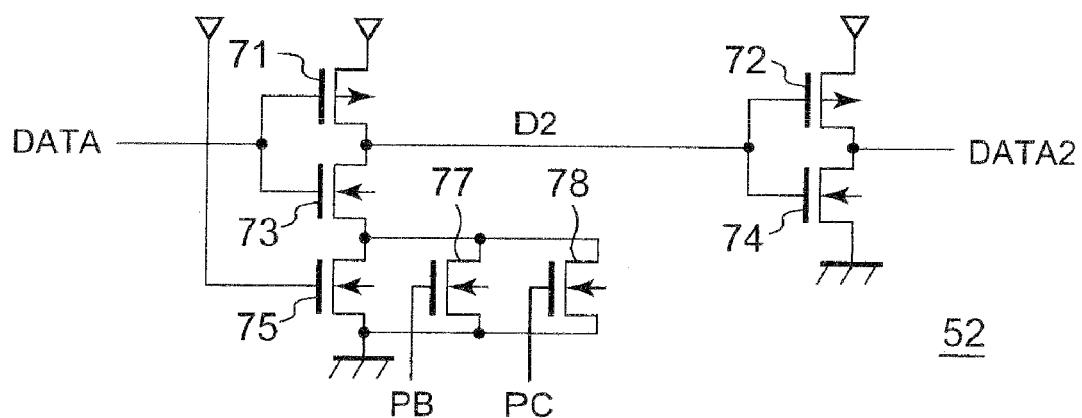

FIG. 4B is a circuit diagram illustrating an exemplary configuration of the delay circuit 52 contributing to drive signal P2. The delay circuit 52 is different from the delay circuit 51 illustrated in FIG. 4A in that the NMOS transistor 76 receiving impedance setting code PA is not included. Accordingly, the delay time of output data DATA is varied by the delay circuit 52 according to impedance setting codes PB and PC.

Figure 4C:
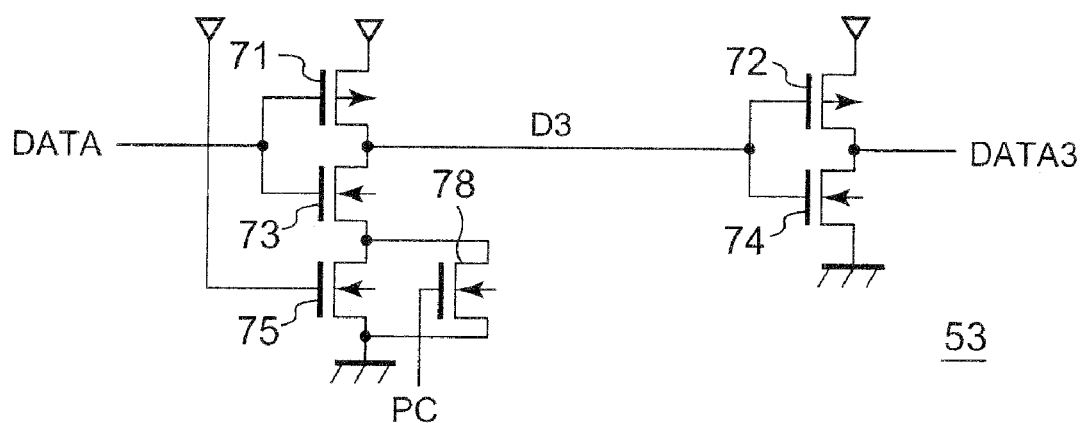

FIG. 4C is a circuit diagram illustrating an exemplary configuration of the delay circuit 53 contributing to drive signal P3. The delay circuit 53 is different from the delay circuit 52 illustrated in FIG. 4B in that the NMOS transistor 77 receiving impedance setting code PB is not included. Accordingly, the delay time of output data DATA is varied by the delay circuit 53 according to impedance setting code PC.

Figure 5A:
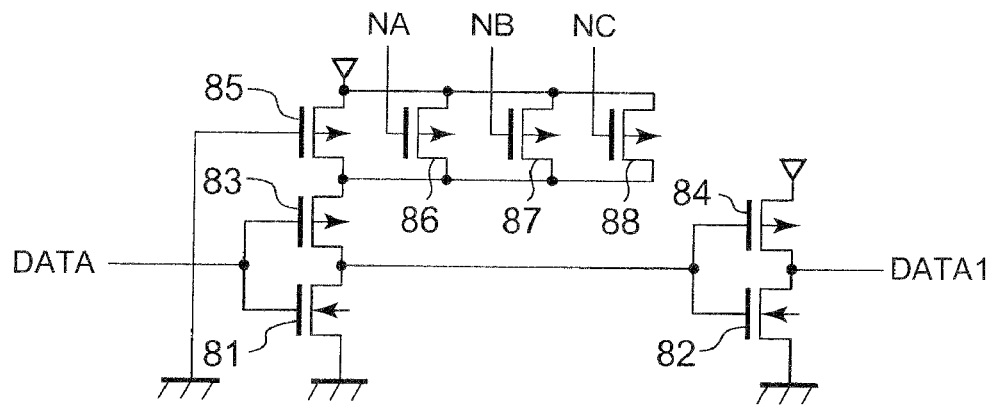
FIGS. 5A to 5C are circuit diagrams illustrating exemplary configurations of delay circuits that contribute to drive signals N1, N2 and N3, respectively.

FIG. 5A is a circuit diagram illustrating an exemplary configuration of the delay circuit 61 contributing to drive signal N1. The delay circuit 61 has NMOS transistors 81 and 82 and PMOS transistors 83 to 88. The NMOS transistors 81 and PMOS transistors 83 and 85 to 88 constitute a first inverter. The NMOS transistor 82 and PMOS transistor 84 constitute a second inverter. The first inverter and second inverter are connected in series. In the first inverter, supplied to the gates of the NMOS transistor 81 and PMOS transistor 83 is output data DATA. The PMOS transistors 85 to 88 are connected in parallel between the PMOS transistor 83 and the power source. The gate of PMOS transistor 85 is connected to the ground. Impedance setting codes NA to NC are supplied to the gates of the PMOS transistors 86 to 88, respectively. Using this configuration, the delay time of output data DATA is varied by the delay circuit 61 according to impedance setting codes NA to NC.

Figure 5B:
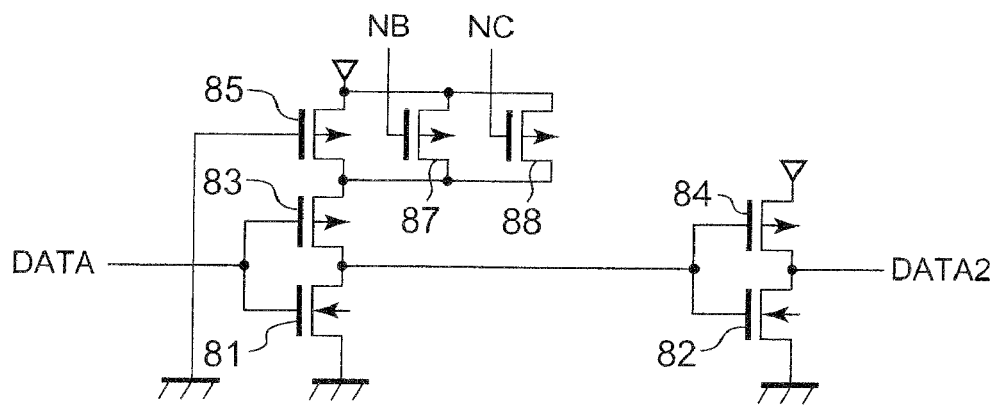

FIG. 5B is a circuit diagram illustrating an exemplary configuration of the delay circuit 62 contributing to drive signal N2. The delay circuit 62 is different from the delay circuit 61 illustrated in FIG. 5A in that the PMOS transistor 86 receiving impedance setting code NA is not included. Accordingly, the delay time of output data DATA is varied by the delay circuit 62 according to impedance setting codes NB and NC.

Figure 5C:
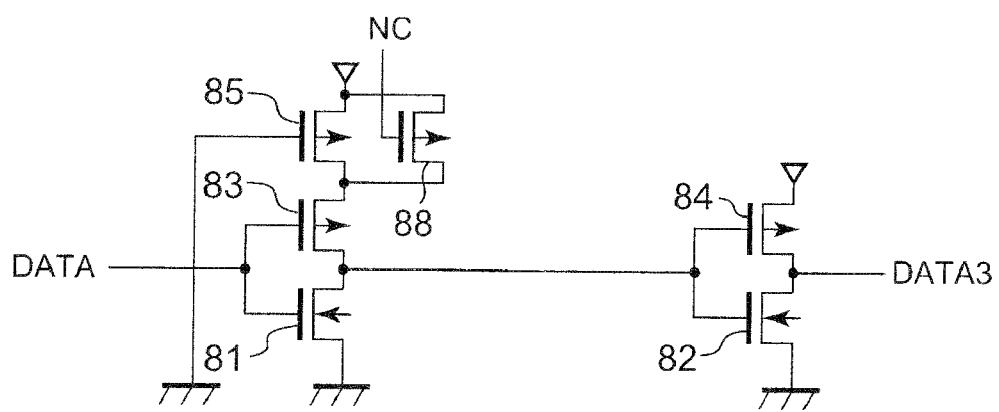

FIG. 5C is a circuit diagram illustrating an exemplary configuration of the delay circuit 63 contributing to drive signal N3. The delay circuit 63 is different from the delay circuit 62 illustrated in FIG. 5B in that the PMOS transistor 87 receiving impedance setting code NB is not included. Accordingly, the delay time of output data DATA is varied by the delay circuit 63 according to impedance setting code NC.

Figure 6:
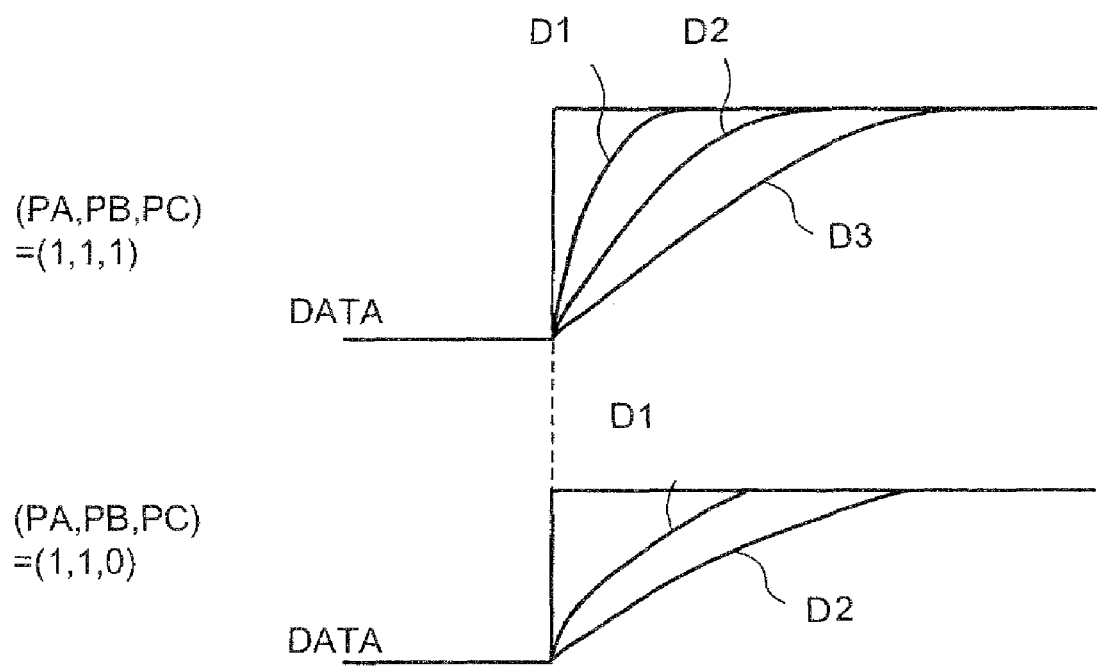
FIG. 6 is a waveform diagram for explaining the operation of the delay circuit according to the present embodiment.

Delaying implemented by the delay circuits 51 to 53 and 61 to 63 is as follows. By way of example, the delay circuits 51 to 53 illustrated in FIGS. 4A to 4C will be described. FIG. 6 illustrates output signal D1 to D3 of first inverter of the delay circuits 51 to 53. A signal DATA illustrated in FIG. 6 is an inversion signal of signal DATA which is supplied with each of first inverter of the delay circuits 51 to 53. Each of second inverter of the delay circuits 51 to 53 is supplied with associated signal D1 to D3. Output data DATA outputted via each of second inverter of the delay circuits 51 to 53 are denoted as DATA1, DATA2 and DATA3, respectively.

Firstly there will be described a case where impedance setting codes {PA, PB, PC} are {1,1,1}. In this case, the NMOS transistors 76 to 78 illustrated in FIGS. 4A to 4C are all turned on. The drivability of the first inverters using the NMOS transistors illustrated respectively in FIGS. 4A to 4B are different from each other and thus the delay times implemented respectively by the delay circuits 51 to 53 are different from each other. More specifically, as illustrated in FIG. 6, the delay time by first inverter of the delay circuit 51 is minimum, and the delay time by first inverter of the delay circuit 53 is maximum (D1<D2<D3). That is, the delay time of drive signal P1 is minimum, and the delay time of drive signal P3 is maximum.

Next, there will be described a case where impedance setting codes {PA, PB, PC} are {1,1,0}. When impedance setting code PC is "0", drive signal P3 is invariably "1"; therefore, contribution of D3 does not need to be considered, so D3 is not illustrated in FIG. 6. When {PA, PB, PC} are {1,1,0}, the NMOS transistor 78 is turned off. In this case, also, the respective delay times have different values; as illustrated in FIG. 6, the delay time by first inverter of the delay circuit 51 is minimum (D1<D2). It should be noted here that the respective delay times are different to a large extent from each other, compared to the above described case where {PA, PB, PC} are {1,1,1}. This is because the NMOS transistor 78 turns off, reducing the drivability of the first inverter in the delay circuits 51 to 53. As a result, the delay times of drive signals P1 and P2 are larger when {PA, PB, PC} are {1,1,0}, compared to when {PA, PB, PC} are {1,1,1}.

In this way, the respective delay times of drive signals P1 to P3 vary according to impedance setting codes PA to PC. This means that the respective delay times of drive signals which drive the output transistors to be turned on at a time of outputting output data DATA, vary according to the number of the output transistors to be turned on. More specifically, as the number of the output transistors to be turned on becomes smaller, the delay times of the drive signals P1 to P3 relative to drive signal P0 become longer.

FIG. 7 is a graph chart illustrating an example of operation of the output buffer 1 according to the present embodiment. The abscissa represents time, and the ordinate represents current performance.

Firstly there will be described a case where impedance setting codes {PA, PB, PC} are {1,1,1 }. In this case, all the four output transistors MP0 to MP3 turn on (the ON number=4). However, the output transistors MP0 to MP3 turn on one after the other at different timings t0 to t3. More specifically, as illustrated in FIG. 7, the output transistor MP0 turns on at timing t0; the output transistor MP1 turns on at timing t1 after delay time ΔT1 from timing t0; the output transistor MP2 turns on at timing t2 after delay time ΔT2 (>ΔT1) from timing t0; the output transistor MP3 turns on at timing t3 after delay time ΔT3 (>ΔT2) from timing t0. In this way, the four output transistors MP0 to MP3 turn on one after the other; consequently, an output waveform having a slew rate is provided.

Next, there will be described a case where impedance setting codes {PA, PB, PC} are set to {1,1,0} to achieve a desired output impedance. In this case, three output transistors MP0 to MP2 turn on; and the output transistor MP3 does not turn on. That is, three transistors turn on. In addition, the output transistors MP0 to MP2 turn on one after the other at different timings t0 to t2'. More specifically, as illustrated in FIG. 7, at timing t0, the output transistor MP0 turns on. At timing t1' after delay time ΔT1' from timing t0, the output transistor MP1 turns on. At timing t2' (>ΔT1') after delay time ΔT2' from timing t0, the output transistor MP2 turns on. Here, delay time ΔT1' is larger than the delay time ΔT1; and delay time ΔT2' is larger than the delay time ΔT2. That is, an automatic adjustment is made so that, as the number of the output transistors to be turned on becomes smaller, the interval between these ON timings becomes longer. As a result, even when the number of the output transistors to be turned on is modified to achieve desired output impedance, the slew rate of output waveform does not vary and is maintained at a constant value.

In this way, in the pre-buffer 10 according to the present embodiment, the respective ON timings of the output transistors to be turned on are variably set in response to impedance setting codes PA to PC. In other words, in the pre-buffer 10, the respective delay times of drive signals P1 to P3 are variably set according to impedance setting codes PA to PC. More specifically, in the pre-buffer 10, as the ON number becomes smaller, the respective delay times of drive signals P1 to P3 are set longer.

The same applies to the pre-buffer 20. In the pre-buffer 20, drive signals N1 to N3 are generated according to output data DATA and impedance setting codes NA to NC. In this case, in the pre-buffer 20, the respective delay times of these drive signals N1 to N3 are variably set according to impedance setting codes NA to NC.

Thus, even when the number of the transistors to be turned on is modified to set the output impedance to a desired value, the slew rate is controlled at a desired range. Consequently, the pre-buffers 10 and 20 also serve as a "slew rate control circuit".

As described above, according to the present embodiment, the ON number of the output transistors is controlled by impedance setting codes PA to PC and NA to NC so that the output impedance is set to a desired value. Further, the respective ON timings of the output transistors to be turned on are controlled by the same impedance setting codes PA to PC and NA to NC so that the slew rate falls into a desired range.

That is, the output impedance and the slew rate are controlled by the same impedance setting codes PA to PC and NA to NC. There is an association between the number and the ON timing of the output transistors to be turned on; when the output impedance is adjusted, the slew rate is automatically adjusted. As a result, while the output impedance is maintained at a desired value, the slew rate can also be controlled at a desired range. Consequently, sufficiently large amplitude of output pulse is provided, and further a malfunction ascribable to noise is prevented.

According to the present embodiment, the output impedance and slew rate do not need to be controlled separately, so codes for output impedance control and codes for slew rate control do not need to be separately prepared. Impedance setting codes PA to PC and NA to NC are used to control the output impedance at a desired value and at the same time contribute to the control of slew rate. Consequently, the number of control signals is reduced, preventing the control from becoming complex. Also, circuit construction becomes simple, thus suppressing the increase of circuit area and the increase of manufacturing cost.

It is apparent that the present invention is not limited to the above embodiments, but may be modified and changed without departing from the scope and spirit of the invention.

What is claimed is:

1. A semiconductor circuit comprising:
   an output buffer having a pre-buffer and a main buffer, said main buffer including a plurality of output transistors connected in parallel and said pre-buffer generating a plurality of driving signals for each driving an associated one of said output transistors in response to a plurality of control signals; and
   an impedance control circuit generating said control signals for controlling a number of said output transistors to be turned on to maintain an output impedance of said main buffer to be a constant value,
   wherein said pre-buffer provides different delay times for each of driving signals in response to a predetermined association between a number of said output transistors to be turned on and lengths of said delay times.

2. The semiconductor circuit according to claim 1, wherein said pre-buffer varies each of said delay times in response to the number of said output transistors to be turned on and maintains a slew rate of said main buffer to be a constant value.

3. The semiconductor circuit according to claim 1, wherein said pre-buffer includes a plurality of delay circuits each having a first inverter circuit receiving said data signal and a second inverter circuit connected to said first inverter circuit and the drivability of said first inverter circuit is controlled by response to said control signals.

4. The semiconductor circuit according to claim 1, wherein said association is that each of said delay times lengthens for a slew rate of said main buffer to be controlled at a constant value when the number of said output transistors to be turned on decreases and each of said delay times shortens for the slew rate of said main buffer to be controlled at a constant value when the number of said output transistors to be turned on increases.

5. A semiconductor circuit comprising:
   a plurality of transistors connected in parallel to each other;
   a control circuit producing control information that identifies one or more of the transistors to be turned on; and
   a plurality of driving circuits each provided for an associated one or more of the transistors, one or more of the driving circuits being activated in response to the control information to supply associated one or more of the transistors with associated driving signal or signals with associated delay time or times that are controlled by the control information, the delay times of the driving signals supplied by the respective ones of the driving circuits being different from each other,
   wherein said control information indicates a number of said driving circuits being activated to maintain an output impedance of said driving circuits to be a constant value and indicates a predetermined length of said delay times in response to the number of said driving circuits being activated.

6. The semiconductor circuit as claimed in claim 5, wherein each of the driving circuits comprises a delay circuit and the control information includes a plurality of bit data, the delay circuit being supplied with at least one of the bit data of the control information to produce a delay signal with a corresponding delay time, the driving signal being produced in response to the delay signal.

7. The semiconductor circuit as claimed in claim 6, wherein each of the driving circuit further comprising a gate circuit receiving the delay signal and the corresponding one of the bit data of the control information and producing the driving signal.

* * * * *